US012708041B2

(12) United States Patent
Choi et al.

(10) Patent No.: US 12,708,041 B2
(45) Date of Patent: Aug. 11, 2026

(54) SEMICONDUCTOR PACKAGE HAVING A FIRST PACKAGE STRUCTURE INCLUDING A FIRST REDISTRIBUTION STRUCTURE AND A SECOND PACKAGE STRUCTURE INCLUDING A SECOND REDISTRIBUTION STRUCTURE

(71) Applicant: SAMSUNG ELECTRONICS CO., LTD., Suwon-si (KR)

(72) Inventors: Mina Choi, Suwon-si (KR); Heejung Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 550 days.

(21) Appl. No.: 18/215,212

(22) Filed: Jun. 28, 2023

(65) Prior Publication Data

US 2024/0136340 A1 Apr. 25, 2024
US 2024/0234388 A9 Jul. 11, 2024

(30) Foreign Application Priority Data

Oct. 21, 2022 (KR) ........................ 10-2022-0136666

(51) Int. Cl.
*H10W 90/00* (2026.01)
*H10W 20/20* (2026.01)
(Continued)

(52) U.S. Cl.
CPC ........... *H10W 90/00* (2026.01); *H10W 20/20* (2026.01); *H10W 70/685* (2026.01);
(Continued)

(58) Field of Classification Search
CPC ........... H01L 23/3128; H01L 23/49816; H01L 23/481; H01L 25/105; H01L 2224/32145;
(Continued)

(56) References Cited

U.S. PATENT DOCUMENTS 9,570,416 B2 2/2017 Haba et al.
9,578,745 B2 2/2017 Yoshikawa et al.
(Continued)

FOREIGN PATENT DOCUMENTS

JP 2002-026250 A 1/2002
KR 10-2011-0065693 A 6/2011
(Continued)

OTHER PUBLICATIONS

Office Action dated Feb. 28, 2026 issued in corresponding to Korean Patent Application No. 10-2022-0136666.

*Primary Examiner* — Khiem D Nguyen
(74) *Attorney, Agent, or Firm* — Morgan, Lewis & Bockius LLP

(57) ABSTRACT

A first package structure including a first redistribution structure, at least one first semiconductor chip disposed on the first redistribution structure, a first encapsulant covering the at least one first semiconductor chip, and a first through-via passing through the first encapsulant; a second package structure including a second redistribution structure, at least one second semiconductor chip disposed on the second redistribution structure, a second encapsulant covering the at least one second semiconductor chip, and a second through-via passing through the second encapsulant. The second package structure is disposed on the first package structure. At least one of a first upper end of the first through-via or a second upper end of the second through-via is between a first non-active surface and a second non-active surface.

20 Claims, 11 Drawing Sheets

(51) Int. Cl.

| | |
|---|---|
| ***H10W 70/685*** | (2026.01) |
| ***H10W 74/10*** | (2026.01) |
| *H10W 72/30* | (2026.01) |
| *H10W 74/15* | (2026.01) |

(52) U.S. Cl.
CPC ........ *H10W 74/117* (2026.01); *H10W 90/701* (2026.01); *H10W 72/353* (2026.01); *H10W 74/15* (2026.01); *H10W 90/724* (2026.01); *H10W 90/732* (2026.01); *H10W 90/734* (2026.01)

(58) Field of Classification Search
CPC ........... H01L 2224/32146; H01L 2224/32225; H10W 90/00; H10W 20/20; H10W 74/117; H10W 90/722; H10W 90/724; H10W 90/732; H10W 90/734
See application file for complete search history.

(56) References Cited

U.S. PATENT DOCUMENTS

| | | | | |
|---|---|---|---|---|
| 9,589,936 | B2 | 3/2017 | Zhai et al. | |
| 9,691,726 | B2 | 6/2017 | Cheng et al. | |
| 10,971,476 | B2 | 4/2021 | Gu et al. | |
| 2010/0084175 | A1* | 4/2010 | Suzuki | H01L 23/49816 174/260 |
| 2013/0069222 | A1 | 3/2013 | Camacho | |
| 2018/0277517 | A1* | 9/2018 | Kim | H10N 50/10 |
| 2020/0381405 | A1* | 12/2020 | Patil | H01L 21/6835 |
| 2021/0272906 | A1* | 9/2021 | Kim | H01L 25/0657 |
| 2021/0407924 | A1* | 12/2021 | Lee | H01L 25/105 |
| 2022/0013441 | A1* | 1/2022 | Liu | H01L 23/49811 |

FOREIGN PATENT DOCUMENTS

| | | |
|---|---|---|
| KR | 10-2016-0129407 | 11/2016 |
| WO | 2017122449 A | 7/2017 |

* cited by examiner

C

SEMICONDUCTOR PACKAGE HAVING A FIRST PACKAGE STRUCTURE INCLUDING A FIRST REDISTRIBUTION STRUCTURE AND A SECOND PACKAGE STRUCTURE INCLUDING A SECOND REDISTRIBUTION STRUCTURE

CROSS-REFERENCE TO RELATED APPLICATION

This application claims priority under 35 U.S.C. § 119 to Korean Patent Application No. 10-2022-0136666 filed on Oct. 21, 2022 in the Korean Intellectual Property Office, the disclosure of which is incorporated by reference herein in its entirety.

TECHNICAL FIELD

The present inventive concept relates to a semiconductor package.

DISCUSSION OF THE RELATED ART

In accordance with a reduced weight and a high performance of electronic devices, the development of miniaturized and highly efficient semiconductor packages is desired in the field of semiconductor packages. Generally, semiconductor packages including a plurality of semiconductor chips may have an increased volume of an encapsulant, deteriorated heat dissipation characteristics, or increased process difficulty due to an increase in interfaces between the encapsulant and the semiconductor chips.

SUMMARY

According to an embodiment of the present inventive concept, a semiconductor package includes: a first package structure including a first redistribution structure, at least one first semiconductor chip, a first encapsulant, and a first through-via, wherein the first redistribution structure has a first front surface and a first rear surface, which oppose each other, and includes a first redistribution layer, wherein the at least one first semiconductor chip has a first active surface and a first non-active surface opposite to the first active surface, wherein a first connection pad is disposed on the first active surface and is electrically connected to the first redistribution layer, wherein the at least one first semiconductor chip is disposed on the first redistribution structure such that the first active surface faces the first front surface, wherein the first encapsulant covers at least a portion of the at least one first semiconductor chip, and wherein the first through-via is electrically connected to the first redistribution layer and passes through the first encapsulant; a second package structure including a second redistribution structure, at least one second semiconductor chip, a second encapsulant, and a second through-via, wherein the second redistribution structure has a second front surface and a second rear surface, which oppose each other, and includes a second redistribution layer, wherein the at least one second semiconductor chip has a second active surface and a second non-active surface opposite to the second active surface, wherein a second connection pad is disposed on the second active surface and is electrically connected to the second redistribution layer, wherein the at least one second semiconductor chip is disposed on the second redistribution structure such that the second active surface faces the second front surface, wherein the second encapsulant covers at least a portion of the at least one second semiconductor chip, and wherein the second through-via is electrically connected to the second redistribution layer and the first through-via and passes through the second encapsulant, wherein the second package structure is disposed on the first package structure such that the second front surface faces the first front surface, wherein at least one of a first upper end of the first through-via or a second upper end of the second through-via, which face each other, is located on a level that is between the first non-active surface and the second non-active surface.

According to an embodiment of the present inventive concept, a semiconductor package includes: a first package structure including a first redistribution structure, a first semiconductor chip, a first encapsulant, and a first through-via, wherein the first redistribution structure includes a first redistribution layer, wherein the first semiconductor chip has a first active surface and a first non-active surface opposite to the first active surface, wherein a first connection pad is electrically connected to the first redistribution layer and is disposed on the first active surface, wherein the first semiconductor chip is disposed such that the first active surface faces the first redistribution structure, wherein the first encapsulant covers at least a portion of the first semiconductor chip, and wherein the first through-via is electrically connected to the first redistribution layer and passes through the first encapsulant; a second package structure including a second redistribution structure, a second semiconductor chip, a second encapsulant, and a second through-via, wherein the second redistribution structure includes a second redistribution layer, wherein the second semiconductor chip has a second active surface and a second non-active surface opposite to the second active surface, wherein a second connection pad is electrically connected to the second redistribution layer and is disposed on the second active surface, wherein the second semiconductor chip is disposed such that the second active surface faces the second redistribution structure, wherein the second encapsulant covers at least a portion of the second semiconductor chip, and wherein the second through-via is electrically connected to the second redistribution layer and passes through the second encapsulant, wherein the second redistribution structure is disposed on the first package structure such that the second non-active surface faces the first non-active surface; and a film structure including an insulating resin and conductive particles, wherein the insulating resin fills a gap between the first package structure and the second package structure, wherein the conductive particles are dispersed in the insulating resin to electrically connect the first through-via to the second through-via.

According to an embodiment of the present inventive concept, a semiconductor package includes: a first package structure including a first redistribution structure, a first semiconductor chip, a first encapsulant, and a first through-via, wherein the first redistribution structure includes a first insulating layer, which provides a first front surface and a first rear surface, and a first redistribution layer that is disposed within the first insulating layer, wherein the first semiconductor chip is disposed on the first front surface, wherein the first encapsulant covers at least a portion of the first semiconductor chip, and wherein the first through-via is electrically connected to the first redistribution layer and passes through the first encapsulant; a second package structure including a second redistribution structure, a second semiconductor chip, a second encapsulant, and a second through-via, wherein the second redistribution structure includes a second insulating layer, which provides a second front surface and a second rear surface, and a second redistribution layer disposed within the second insulating layer, wherein the second semiconductor chip is disposed on the second front surface, wherein the second encapsulant covers at least a portion of the second semiconductor chip, and wherein the second through-via electrically connects the second redistribution layer to the first through-via and passes through the second encapsulant, wherein the second package structure is disposed on the first package structure such that the second front surface and the first front surface face each other; and a bump structure disposed on the first rear surface of the first package structure and electrically connected to at least a portion of the first redistribution layer that is exposed from the first insulating layer, wherein the second insulating layer covers a surface of the second redistribution layer that is adjacent to the second rear surface.

BRIEF DESCRIPTION OF DRAWINGS

The above and other aspects of the present inventive concept will become more apparent by describing in detail example embodiments thereof, with reference to the accompanying drawings, in which.

DETAILED DESCRIPTION OF THE EMBODIMENTS

Hereinafter, embodiments of the present inventive concept will be described with reference to the accompanying drawings.

Figure 1A:
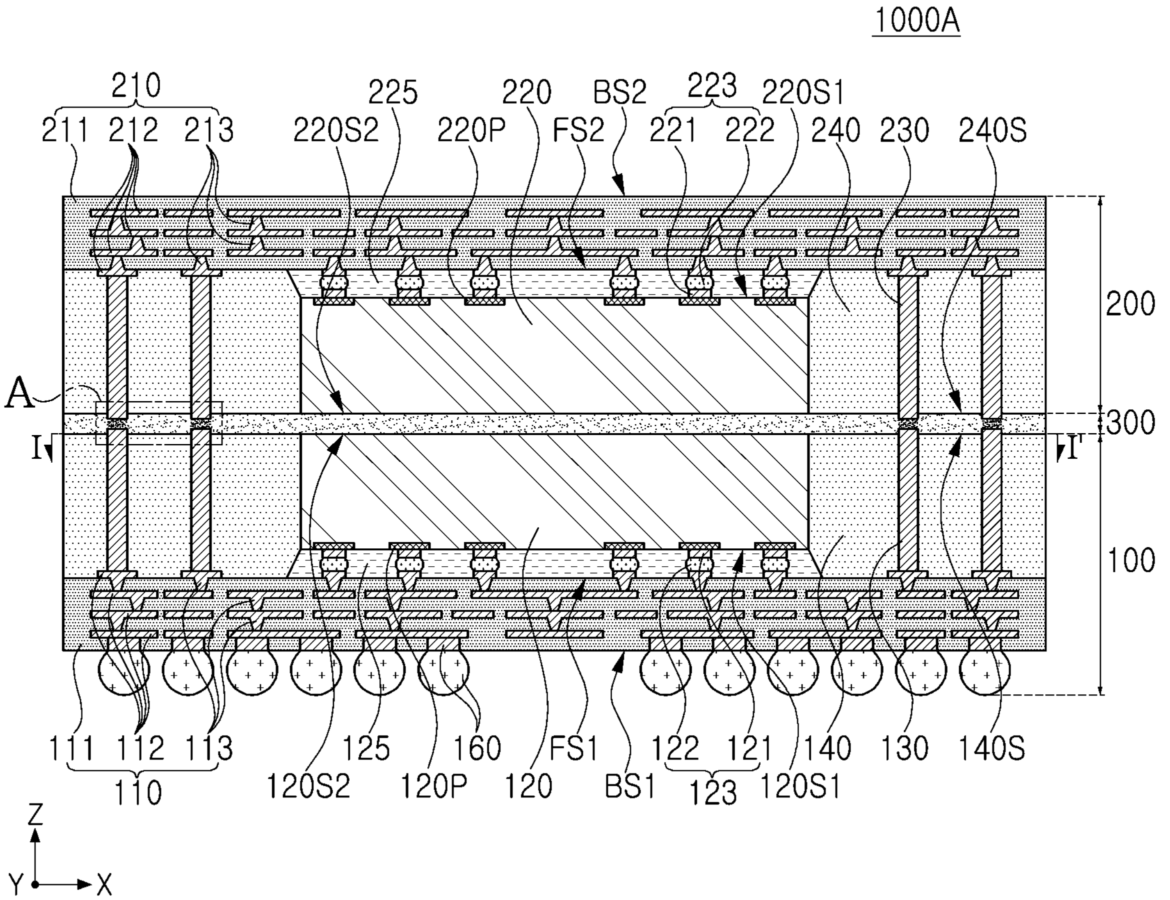
FIG. 1A is a cross-sectional view of a semiconductor package according to an embodiment of the present inventive concept.
Figure 1B:
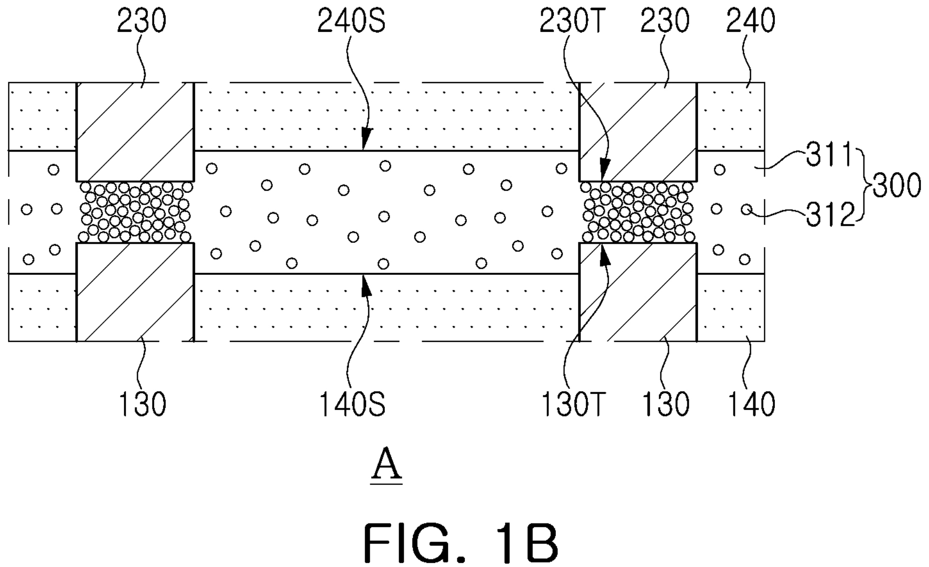
FIG. 1B is a partially enlarged view of region 'A' of FIG. 1A.

FIG. 1A is a cross-sectional view of a semiconductor package 1000A according to an embodiment of the present inventive concept. FIG. 1B is a partially enlarged view of region 'A' of FIG. 1A, and FIG. 1C a cross-sectional view taken along line I-I' of FIG. 1A.

Figure 1C:
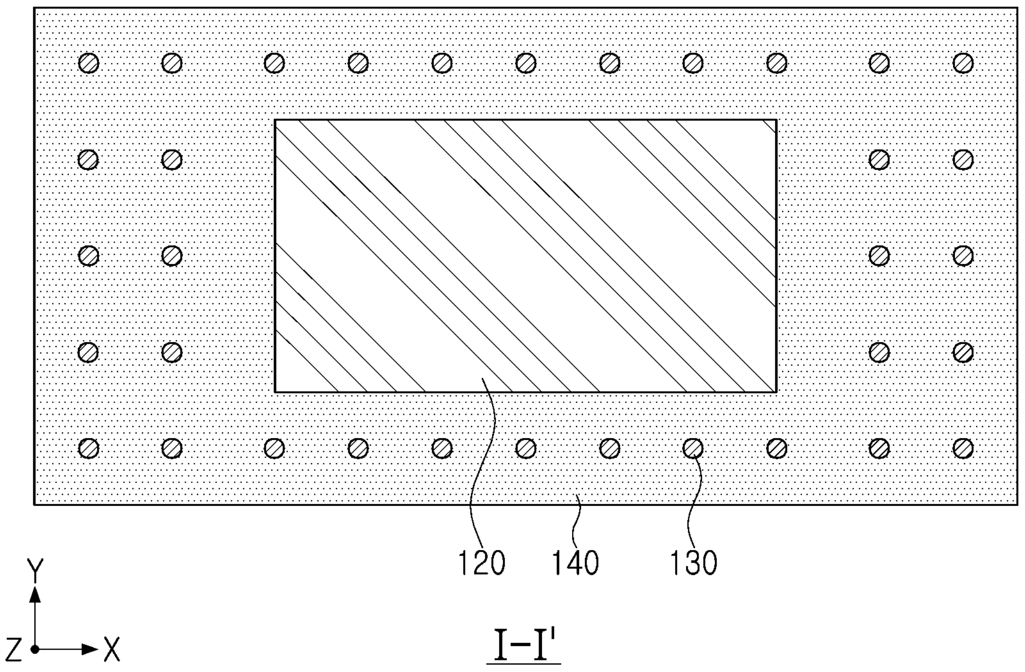
FIG. 1C is a cross-sectional view, taken along line I-I' of FIG. 1A.

Referring to FIGS. 1A to 1C, the semiconductor package 1000A according to an embodiment of the present inventive concept may include a first package structure 100, a second package structure 200, and a film structure 300.

In an embodiment of the present inventive concept, the first package structure 100 and the second package structure 200 may be stacked on each other such that a first non-active surface 120S2 of a first semiconductor chip 120 and a second non-active surface 220S2 of the second semiconductor chip 220 face each other. For example, the second package structure 200 may be disposed on the first package structure 100 such that a second front surface FS2 of the second redistribution structure 210 faces a first front surface FS1 of the first redistribution structure 110.

In an embodiment of the present inventive concept, the first package structure 100 and the second package structure 200 may be electrically connected through a first through-via 130 and a second through-via 230. For example, the first through-via 130 may have a first lower end, which is electrically connected to the first redistribution layer 112, and a first upper end 130T, which is electrically connected to the second through-via 230. The second through-via 230 may have a second lower end, which is electrically connected to the second redistribution layer 212, and a second upper end 230T electrically connected to the first through-via 130.

In an embodiment of the present inventive concept, the first through-via 130 and the second through-via 230 may be electrically connected to each other by the film structure 300. At least one of the first through-via 130 and the second through-via 230 may extend into an insulating resin 311 of the film structure 300. For example, the first upper end 130T of the first through-via 130 may protrude beyond a surface 140S of a first encapsulant 140 that is opposite to the first front surface FS1, and the second upper end 230T of the second through-via 230 may protrude beyond a surface 240S of a second encapsulant 240. According to some embodiments of the present inventive concept, one of the first through-via 130 and the second through-via 230 may extend into the insulating resin 311.

In an embodiment of the present inventive concept, at least one of the first upper end 130T of the first through-via 130 and/or the second upper end 230T of the second through-via 230 facing each other may be located on a level between the first non-active surface 120S2 and the second non-active surface 220S2.

In an embodiment of the present inventive concept, the semiconductor package 1000A may include a bump structure 160 disposed on one side. For example, the semiconductor package 1000A may include the bump structure 160 disposed on a rear surface BS1 of the first package structure 100. The bump structure 160 may be electrically connected to at least a portion of the first redistribution layer 112 that is exposed from the first insulating layer 111. The semiconductor package 1000A may be connected to an external device, such as a module substrate or a system board through the bump structure 160. For example, the bump structures 160 may have a shape of a combination of a pillar (or under bump metal) and a ball. The pillar may include, for example, copper (Cu) or an alloy of copper (Cu), and the ball may include a low melting point metal, for example, tin (Sn) or an alloy (Sn—Ag—Cu) including tin (Sn). According to some embodiments of the present inventive concept, the bump structures 160 may include only pillars or balls. According to some embodiments of the present inventive concept, a resist layer may be formed on the first rear surface BS1 to protect the bump structures 160 from external physical and chemical damage.

In an embodiment of the present inventive concept, an element for external connection might not be disposed on the other side of the semiconductor package 1000A. For example, at least a portion of the first redistribution layer 112 that is adjacent to the first rear surface BS1 may be exposed from the first insulating layer 111, and the second redistribution layer 212 that is adjacent to the second rear surface BS2 might not be exposed from the second insulating layer 211. For example, the second insulation layer 211 of the second redistribution structure 210 may cover the entire surface of the second redistribution layer 212 adjacent to the second rear surface BS2.

In an embodiment of the present inventive concept, the first non-active surface 120S2 of the first semiconductor chip 120 may be exposed from a first encapsulant 140, and the second non-active surface 220S2 of the second semiconductor chip 220 may be exposed from the second encapsulant 240. In addition, the first encapsulant 140 might not be inserted between the first non-active surface 120S2 and the film structure 300, and the second encapsulant 240 might not be inserted between the second non-active surface 220S2 and the film structure 300. For example, the first encapsulant 140 might not cover the first non-active surface 120S2, and the second encapsulant 240 might not cover the second non-active surface 220S2.

As described above, according to an embodiment of the present inventive concept, by minimizing an interface formed between the encapsulant (e.g., '140' or '240') and the semiconductor chip (e.g., '120' or '220'), process risks, such as voids and interface delamination, may be reduced, and heat dissipation characteristics of the semiconductor package may be improved. In addition, since the first package structure 100 and the second package structure 200, which are discontinuously and independently manufactured, are physically and electrically coupled by the film structure 300, process risks may be reduced compared to a case in which the first package structure 100 and the second package structures 200 are continuously and sequentially formed. According to some embodiments of the present inventive concept, the film structure 300 may be omitted (refer to FIG. 3A), but even in this case, the first package structure 100 and the second package structure 200 may be separately manufactured.

Hereinafter, each component of the first package structure 100, the second package structure 200, and the film structure 300 will be described.

The first package structure 100 may include the first redistribution structure 110, at least one first semiconductor chip 120, the first through-via 130, and the first encapsulant 140.

The first redistribution structure 110 may be a support substrate, on which the semiconductor chip 120 is mounted, and may have a first front surface FS1 and a first rear surface BS1 facing each other and may include a first insulating layer 111, a first redistribution layer 112, and a first redistribution via 113.

The first insulating layer 111 may include an insulating resin. The insulating resin is a thermosetting resin, such as an epoxy resin, a thermoplastic resin, such as polyimide, or a resin impregnated with an inorganic filler in these resins, for example, prepreg, Ajinomoto build-up film (ABF), FR-4, and BT. For example, the first insulating layer 111 may include a photosensitive resin, such as photo-imageable dielectric (PID). The first insulating layer 111 may include a plurality of first insulating layers 111 stacked in a vertical direction (e.g., a Z-axis direction). Depending on the process, the boundary between the plurality of first insulating layers 111 might not be apparent. The first insulating layer 111 may provide the first front surface FS1 and the first rear surface BS1 of the first redistribution structure 110.

The first redistribution layer 112 may be disposed on or within the first insulating layer 111 and may redistribute the connection pad 120P of the first semiconductor chip 120. The first redistribution layer 112 may include a metal material, for example, copper (Cu), aluminum (Al), silver (Ag), tin (Sn), gold (Au), nickel (Ni), lead (Pb), titanium (Ti), or alloys thereof. The first redistribution layer 112 may perform various functions. For example, the first redistribution layer 112 may include a ground (GND) pattern, a power (PoWeR: PWR) pattern, and a signal (S) pattern. Here, the signal (S) pattern may provide a transmission path for various signals, e.g., data signals, excluding the ground (GND) pattern and the power (PWR) pattern. The first redistribution layer 112 may include more or fewer redistribution layers than shown in the drawings. The first redistribution layer 112 may include first front surface pads disposed on the first front surface FS1 of the first redistribution structure 110. The first front surface pads may be connected to the connection pad 120P of the first semiconductor chip 120 and the first through-via 130.

The first redistribution via 113 may pass through the first insulating layer 111 and be electrically connected to the first redistribution layer 112. For example, the first redistribution vias 113 may interconnect first redistribution layers 112, which are on different levels, to each other. The first redistribution via 113 may include, for example, a signal via, a ground via, and a power via. The first redistribution via 113 may include a metal material including, for example, copper (Cu), aluminum (Al), silver (Ag), tin (Sn), gold (Au), nickel (Ni), lead (Pb), titanium (Ti), or alloys thereof. The first redistribution via 113 may be a filled via, which may be formed by filling an inside of a via hole with a metal material, or a conformal via, in which a metal material extends along an inner wall of the via hole.

The first semiconductor chip 120 may include a first active surface 120S1, on which a first connection pad 120P electrically that is connected to the first redistribution layer 112 is disposed, and a first non-active surface 120S2 that is opposite to the first active surface 120S1. The first semiconductor chip 120 may be disposed on the first front surface FS1 of the first redistribution structure 110. For example, the first semiconductor chip 120 may be disposed on the first redistribution structure 110 such that the first active surface 120S1 faces the first front surface FS1. According to some example embodiments of the present inventive concept, the first semiconductor chip 120 may be provided as a plurality of semiconductor chips. The first semiconductor chip 120 may be connected to the first redistribution layer 112 through the first connection bump 123. The first connection bump 123 may be disposed between the first connection pad 120P and the first redistribution layer 112. For example, the first connection bump 123 may include a pillar portion 121, which is in contact with the first connection pad 120P, and a solder portion 122, which is in contact with the first redistribution layer 112. According to some embodiments of the present inventive concept, an underfill layer 125 may be disposed between the first semiconductor chip 120 and the first redistribution structure 110. The underfill layer 125 may include an insulating resin, such as an epoxy resin, and may physically and electrically protect the first connection bumps 123. For example, the underfill layer 125 may have a capillary underfill (CUF) structure, but the present inventive concept is not limited thereto. According to some embodiments of the present inventive concept, the underfill layer 125 may have a molded underfill (MUF) structure integrated with the encapsulant 140.

The first semiconductor chip 120 may be an integrated circuit (IC) in a bare state, in which no bumps or wiring layers are formed, but the present inventive concept is not limited thereto, and the first semiconductor chip 120 may be a packaged type IC. The IC may be a processor chip, such as a central processing unit (CPU), a graphics processing unit (GPU), a field programmable gate array (FPGA), an application processor (AP), a digital signal processor, a cryptographic processor, a microprocessor, a microcontroller, but the present inventive concept is not limited thereto and may be logic chips, such as an analog-to-digital converter (ADC) and an application-specific IC (ASIC) or may be memory chips including volatile memories, such as dynamic RAM (DRAM) and static RAM (SRAM) and non-volatile memories, such as phase change RAM (PRAM), magnetic RAM (MRAM), resistive RAM (RRAM), and a flash memory. For example, the first semiconductor chip 120 may include a graphics double data rate (GDDR) RAM.

The first through-via 130 may be electrically connected to the first redistribution layer 112 by passing through the first encapsulant 140. The first through-via 130 may be electrically connected to the second package structure 200. The first through-via 130 may extend in a direction (the Z-direction), substantially perpendicular to the first front surface FS1 of the first redistribution structure 110. For example, the first through-via 130 may have a post shape passing through the encapsulant 140. However, a shape of the first through-via 130 is not limited thereto. In an embodiment of the present inventive concept, the first through-via 130 may have a first lower end, which is electrically connected to the first redistribution layer 112, and a first upper end 130T, which is electrically connected to the second through-via 230. The first through-via 130 may include a metal material, such as copper (Cu). According to some embodiments of the present inventive concept, a metal seed layer including, for example, titanium (Ti), copper (Cu), or the like may be formed on a lower surface of the first through-via 130.

The first encapsulant 140 may be disposed on the first redistribution structure 110 and may encapsulate at least a portion of each of the first semiconductor chip 120 and the first through-via 130. For example, the first encapsulant 140 may cover at least a portion of each of the first semiconductor chip 120 and the first through-via 130. The first encapsulant 140 may be formed to at least partially surround side surfaces of the first semiconductor chip 120 and side surfaces of the first through-via 130. The first encapsulant 140 may be, for example, a thermosetting resin, such as epoxy resin, a thermoplastic resin, such as polyimide, or a prepreg formed by impregnating an inorganic filler in these resins, ABF, FR-4, BT, and EMC.

The second package structure 200 may include components having characteristics the same as or similar to those of the first package structure 100 described above. Hereinafter, the components of the second package structure 200 are referred to as the same terms as those of the corresponding components of the first package structure 100, and redundant descriptions may be omitted or briefly discussed. In addition, components of the first package structure 100 and the second package structure 200 are distinguished from each other using ordinal numbers (e.g., 'first' and 'second') and reference numbers.

The second package structure 200 may include a second redistribution structure 210, at least one second semiconductor chip 220, a second through-via 230, and a second encapsulant 240. The second redistribution structure 210, at least one second semiconductor chip 220, the second through-via 230, and the second encapsulant 240 may have characteristics the same as or similar to those of the first redistribution structure 110, at least one first semiconductor chip 120, the first through-via 130, and the first encapsulant 140 of the first package structure 100, respectively.

The second redistribution structure 210 may be a support substrate on which the second semiconductor chip 220 is mounted, and may have the second front surface FS2 and the second rear surface BS2 facing each other. The second redistribution structure 210 may include a second insulating layer 211, a second redistribution layer 212 and a second redistribution via 213.

The second semiconductor chip 220 may include a second active surface 220S1, on which a second connection pad 220P that is electrically connected to the second redistribution layer 212 is disposed, and a second non-active surface 220S2 that is opposite to the second active surface 220S1, and the second semiconductor chip 220 may be disposed on the second front surface FS2 of the second redistribution structure 210. For example, the second semiconductor chip 220 may be disposed on the second redistribution structure 210 such that the second active surface 220S1 faces the second front surface FS2 of the second redistribution structure 210. According to some embodiments of the present inventive concept, the second semiconductor chip 220 may be provided as a plurality of semiconductor chips. The second semiconductor chip 220 may be connected to the second redistribution layer 212 through a second connection bumps 223. For example, the second connection bump 223 may include a pillar portion 221, which is in contact with the second connection pad 220P, and a solder portion 222, which is in contact with the second redistribution layer 212. According to some embodiments of the present inventive concept, an underfill layer 225 may be disposed between the second semiconductor chip 220 and the second redistribution structure 210. The second semiconductor chip 220 may include the same type of semiconductor chip as that of the first semiconductor chip 120, for example, a GDDR RAM, but the present inventive concept is not limited thereto.

The second through-via 230 may be electrically connected to the second redistribution layer 212 by passing through the second encapsulant 240. The second through-via 230 may be electrically connected to the first package structure 100. In an embodiment of the present inventive concept, the second through-via 230 may have a second lower end, which is electrically connected to the second redistribution layer 212, and a first upper end 230T, which is electrically connected to the first through-via 130.

The second encapsulant 240 may be disposed on the second redistribution structure 210 and may encapsulate at least a portion of each of the second semiconductor chip 220 and the second through-via 230. For example, the second encapsulant 240 may cover at least a portion of each of the second semiconductor chip 120 and the second through-via 230. The second encapsulant 240 may be formed to at least partially surround side surfaces of the second semiconductor chip 220 and side surfaces of the second through-via 230.

The film structure 300 may be disposed between the first package structure 100 and the second package structure 200 and may electrically connect the first through-via 130 and the second through-via 230 to each other. The film structure 300 may include an anisotropic conductive film (ACF) including an insulating resin 311 and conductive particles 312.

The insulating resin 311 may fill a gap between the first package structure 100 and the second package structure 200. The insulating resin 311 may include, for example, a thermosetting resin, a thermoplastic resin, or a mixture thereof. For example, the insulating resin 311 may include epoxy resin, polyurethane, acrylic resin, polyethylene, silicone polymer, styrene butadiene block copolymer, and/or styrene-ethylene-propylene-styrene block copolymer. The insulating resin 311 may have a thickness ranging from about 5 μm to about 50 μm, about 5 μm to about 40 μm, or about 10 μm to about 30 μm. For example, a distance between the first and second non-active surfaces 120S2 and 220S2 may range from about 5 μm to about 50 μm, from about 5 μm to about 40 μm, or from about 10 μm to about 30 μm.

The conductive particles 312 may be dispersed in the insulating resin 311. The conductive particles 312 may have a form in which a core particle is coated with a conductive material. The core particle may be, for example, a plastic ball having a diameter ranging from about 1 μm to about 50 μm, about 2 μm to about 40 μm, or about 3 μm to about 30 μm. However, the present inventive concept is not limited thereto, and the core particles may be carbon fibers or conductive particles, such as metal balls. The conductive material applied to the surface of the core particle may include a metal material, for example, gold (Au), silver (Ag), nickel (Ni), or lead (Pd). According to some embodiments of the present inventive concept, a surface of a conductive material, that is, an outer portion of the conductive particles 312, may be coated with an insulating skin layer. Accordingly, electrical conductivity may be exhibited in a compression direction by at least some of the conductive particles 312 having a skin layer destroyed by high-temperature compression.

Figure 2A:
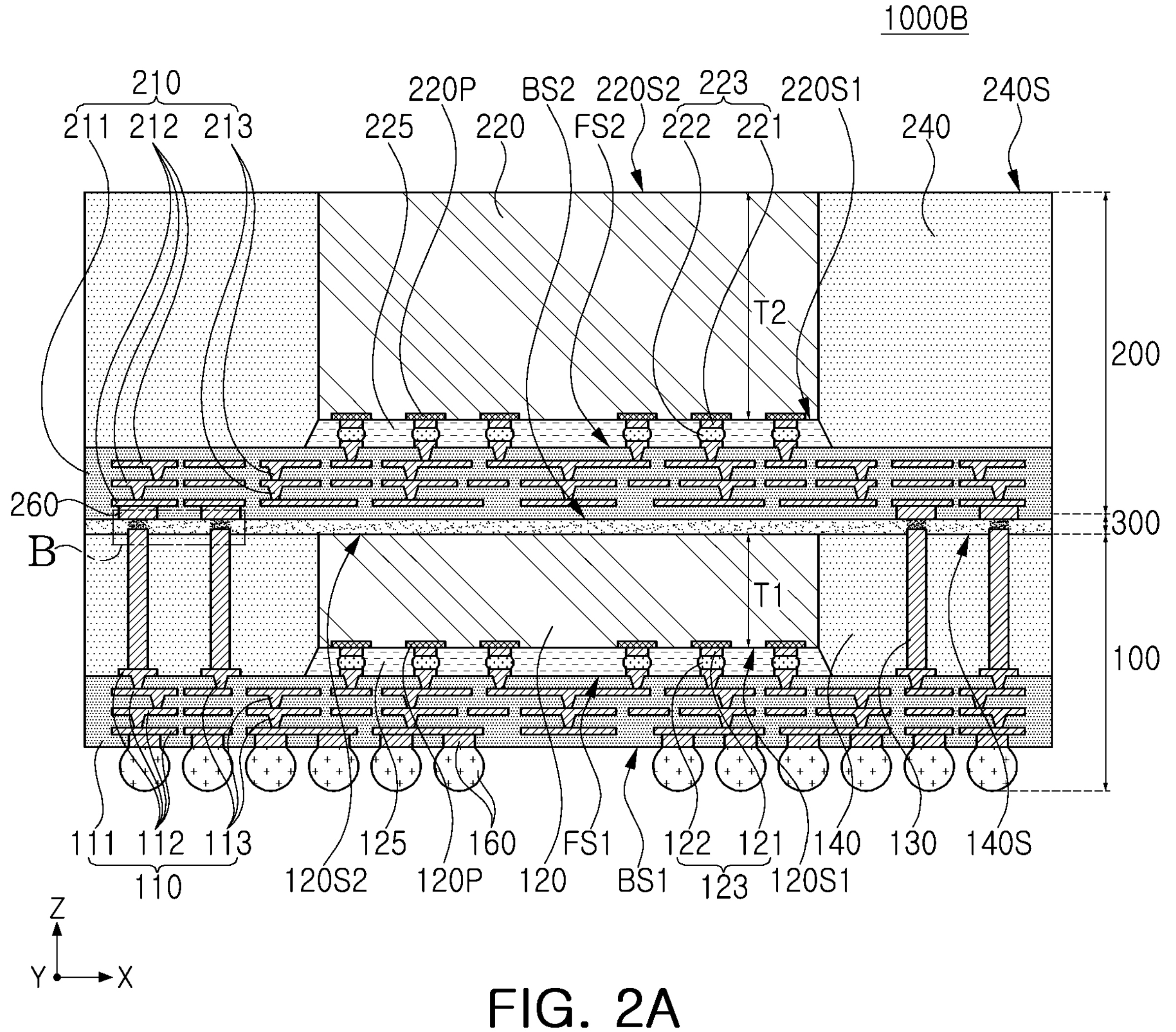
FIG. 2A is a cross-sectional view of a semiconductor package according to an embodiment.
Figure 2B:
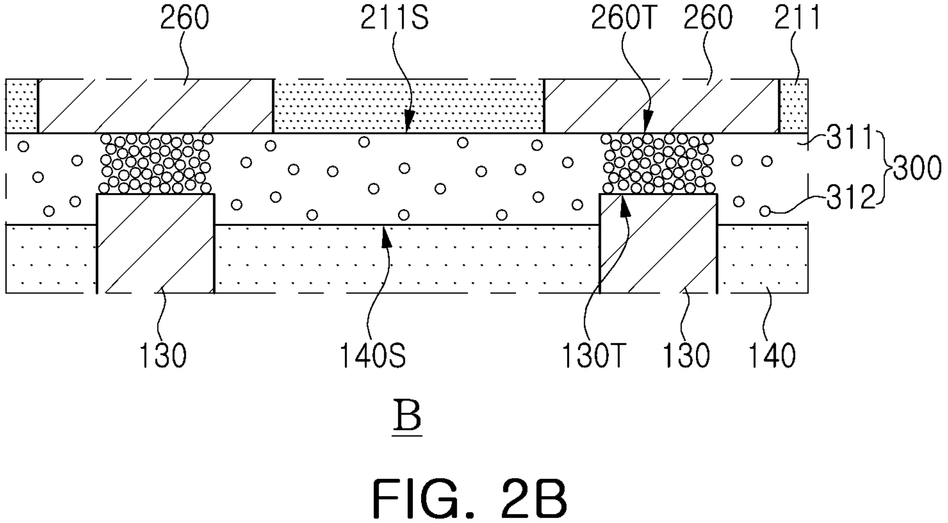
FIG. 2B is a partially enlarged view of region 'B' of FIG. 2A.

FIG. 2A is a cross-sectional view of a semiconductor package 1000B according to an embodiment of the present inventive concept, and FIG. 2B is a partially enlarged view of region 'B' of FIG. 2A.

Referring to FIGS. 2A and 2B, the semiconductor package 1000B according to an embodiment of the present inventive concept may have characteristics the same as or similar to those described above with reference to FIGS. 1A to 1C, except that the first package structure 100 and the second package structure 200 are stacked such that the first non-active surface 120S2 of the first semiconductor chip 120 and the second active surface 220S1 of the second semiconductor chip 220 face each other. For example, the second package structure 200 may be disposed on the first semiconductor package structure 100 such that the second rear surface BS2 of the second redistribution structure 210 faces the first front surface FS1 of the first redistribution structure 110.

In an embodiment of the present inventive concept, the first package structure 100 and the second package structure 200 may be electrically connected to each other through the first through-via 130 and the second bump structure 260. For example, the first through-via 130 may have a first lower end electrically connected to the first redistribution layer 112 and a first upper end 130T electrically connected to the second bump structure 260, and the second bump structure 260 may have a lower end, which is electrically connected to the second redistribution layer 212, and an upper end 260T, which is electrically connected to the first through-via 130. The upper end 260T of the second bump structure 260 may be on substantially the same level as that of a surface 211S of the second insulating layer 211 providing the second rear surface BS2. For example, the upper end 260T may be substantially coplanar with the surface 211S of the second insulating layer 211. According to some embodiments of the present inventive concept, the upper end 260T of the second bump structure 260 may protrude, relative to the surface 211S of the second insulating layer 211.

In an embodiment of the present inventive concept, the first through-via 130 and the second bump structure 260 may be electrically connected to each other by the film structure 300. At least one of the first through-via 130 and the second bump structure 260 may extend into the insulating resin 311 of the film structure 300.

In an embodiment of the present inventive concept, a thickness T2 of the second semiconductor chip 220 may be greater than a thickness T1 of the first semiconductor chip 120. However, the present inventive concept is not limited thereto, and the thickness T2 of the second semiconductor chip 220 may be less than or equal to the thickness T1 of the first semiconductor chip 120.

Figure 3A:
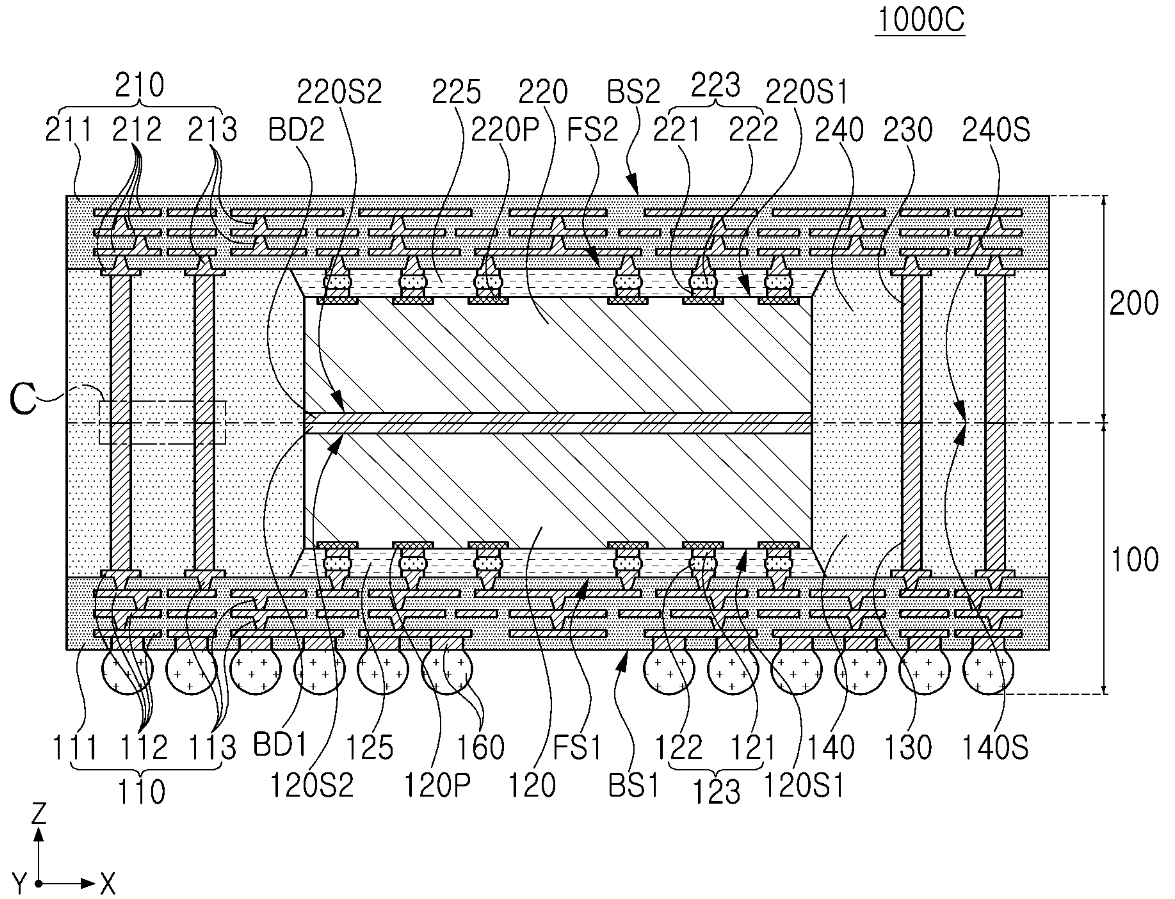
FIG. 3A is a cross-sectional view of a semiconductor package according to an embodiment of the present inventive concept.
Figure 3B:
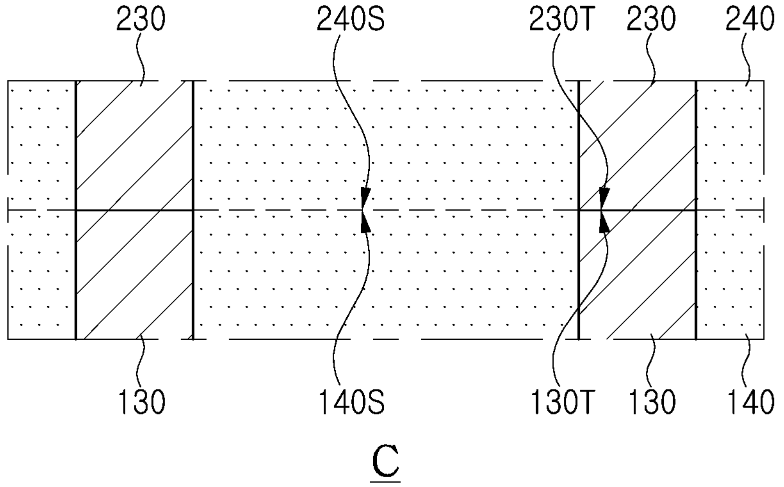
FIG. 3B is a partially enlarged view of region 'C' of FIG. 3A.

FIG. 3A is a cross-sectional view of a semiconductor package 1000C according to an embodiment of the present inventive concept, and FIG. 3B is a partially enlarged view of region 'C' of FIG. 3A.

Referring to FIGS. 3A and 3B, the semiconductor package 1000C according to an embodiment of the present inventive concept may have characteristics the same as or similar to those described above with reference to FIGS. 1A to 2B, except that at least partial regions of the first package structure 100 and the second package structure 200 are directly bonded to each other.

In an embodiment of the present inventive concept, the first semiconductor chip 120 may further include a first bonding layer BD1 that is disposed on the first non-active surface 120S2, and the second semiconductor chip 220 may include a second bonding layer BD2 that is disposed on the second non-active surface 220S2. The first bonding layer BD1 and the second bonding layer BD2 may each include materials so that the first bonding layer BD1 and the second bonding layer BD2 may be bonded and combined to each other. For example, the first bonding layer BD1 and the second bonding layer BD2 may each include at least one of silicon oxide (SiO), silicon nitride (SiN), and/or silicon carbonitride (SiCN). The first bonding layer BD1 and the second bonding layer BD2 may be bonded and combined to each other by performing a thermal compression process. For example, the thermal compression process may be performed in a thermal atmosphere of about 300° C., but the present inventive concept is not limited thereto.

In an embodiment of the present inventive concept, the first upper end 130T of the first through-via 130 and the second upper end 230T of the second through-via 230 may directly contact each other. The first upper end 130T and the second upper end 230T may be located on a level that is between the first and second non-active surfaces 120S2 and 220S2. This structure may be referred to as metal bonding based on the mutually bonded through-vias 130 and 230, hybrid bonding configured as dielectric bonding based on bonding layers BD1 and BD2 bonded to each other, or direct bonding.

In an embodiment of the present inventive concept, the surface 140S of the first encapsulant 140 and the surface 240S of the second encapsulant 240 may be bonded and combined to each other. Depending on the process, a boundary between the surface 140S of the first encapsulant 140 and the surface 240S of the second encapsulant 240 might not be apparent. According to some embodiments of the present inventive concept, an anisotropic conductive film may be disposed between the first encapsulant 140 and the second encapsulant 240 and between the first through-via 130 and the second through-via 230.

Figure 4A:
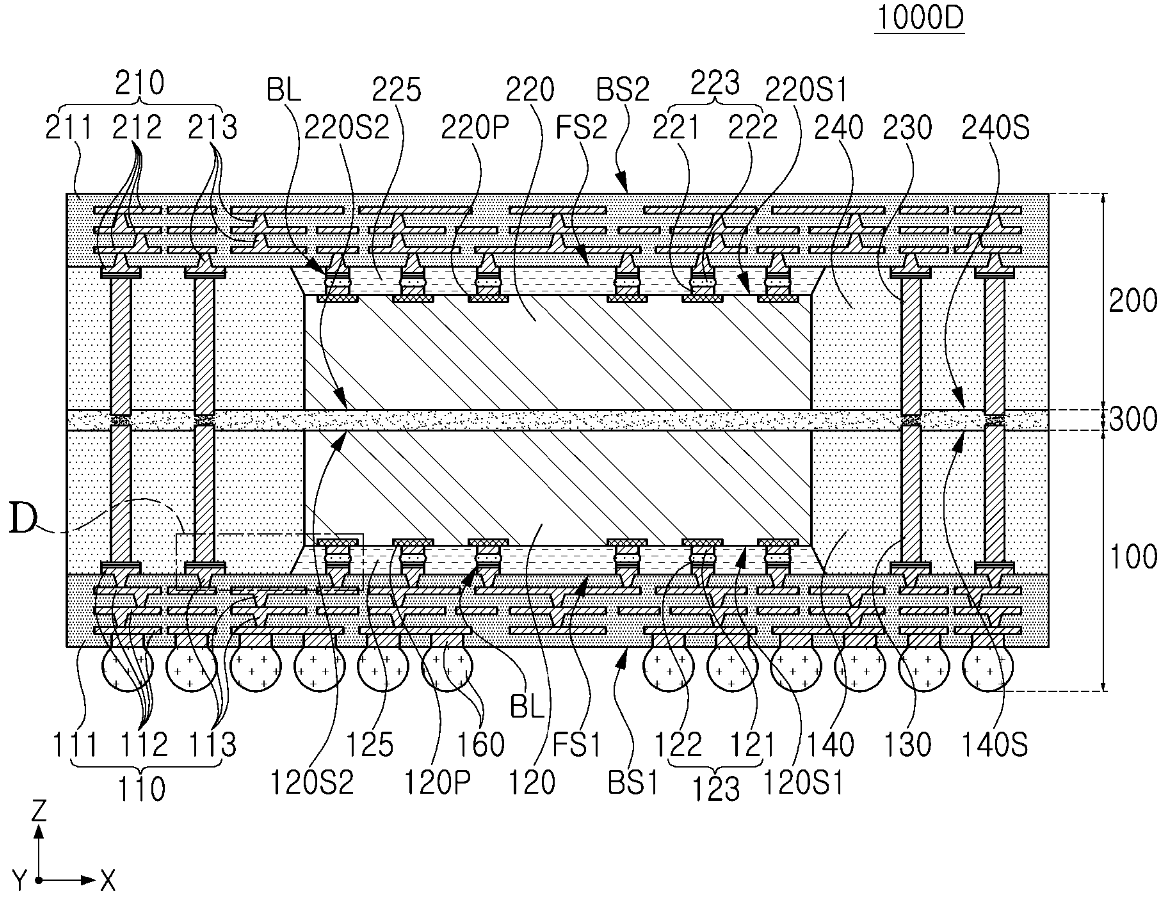
FIG. 4A is a cross-sectional view of a semiconductor package according to an embodiment of the present inventive concept.
Figure 4B:
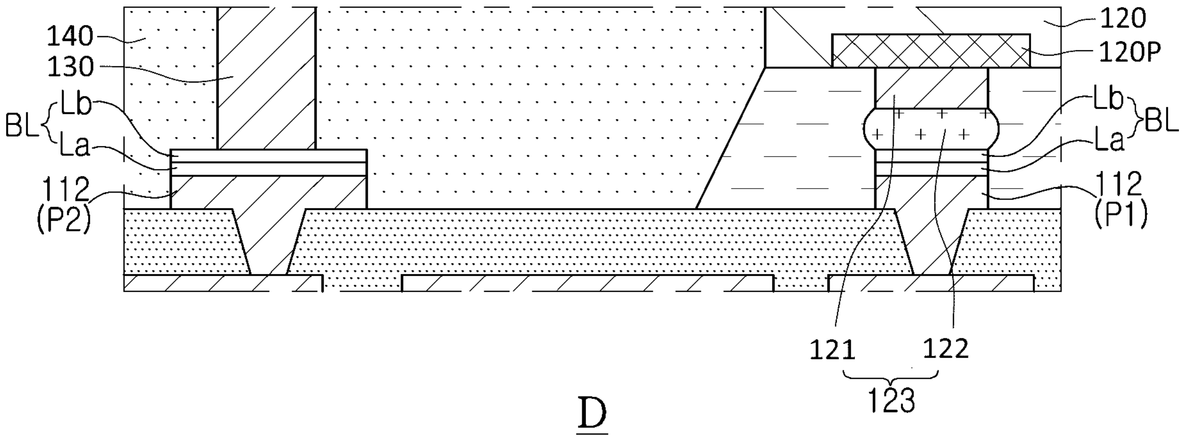
FIG. 4B is a partially enlarged view illustrating region 'D' of FIG. 4A.

FIG. 4A is a cross-sectional view illustrating a semiconductor package 1000D according to an embodiment of the present inventive concept, and FIG. 4B is a partially enlarged view illustrating region 'D' of FIG. 4A.

Referring to FIGS. 4A and 4B, the semiconductor package 1000D according to an embodiment of the present inventive concept may have characteristics the same as or similar to those described above with reference to FIGS. 1A to 3B, except that the semiconductor package 1000D further includes barrier layers BL disposed on the first redistribution layer 112 and the second redistribution layer 212. The barrier layers BL may be disposed on first front surface pads that are disposed on the first front surface FS1 and second front surface pads that are disposed on the second front surface FS2. For example, the first front surface pads of the first redistribution layer 112 may include a first pad P1 and a second pad P2. The first pad P1 may be connected to the first semiconductor chip 120, and the second pad P2 may be connected to the first through-via 130. The barrier layers BL may be disposed between the first pad P1 and the first connection bump 123 and between the second pad P2 and the first through-via 130. For example, the barrier layers BL may be disposed between a second front surface pad of the second front surface pads and the second connection bump 223 and between another second front surface pad of the second front surface pads and the second through-via 230. The barrier layers BL may include a material resistant to oxidation, such as nickel (Ni), gold (Au), or alloys thereof. For example, the barrier layers BL may include a lower layer La, which may include nickel (Ni), and an upper layer Lb, which may include gold Au.

In an embodiment of the present inventive concept, the first connection bump 123 may connect the first connection pad 120P of the first semiconductor chip 120 and at least some of the first front surface pads, that are disposed on the barrier layers BL, to each other. The second connection bump 223 may connect the second connection pad 220P of the second semiconductor chip 220 and at least some of the second front surface pads, which are disposed on the barrier layers BL, to each other.

In an embodiment of the present inventive concept, the first through-via 130 may have a lower end, which is opposite to the first upper end ('130T' in FIG. 1B), contacting the barrier layers BL, and the second through-via 230 may have a lower end, which is opposite to the second upper end ('230T' in FIG. 1B), contacting at least some of the barrier layers BL disposed on the second front surface pads.

Figure 5:
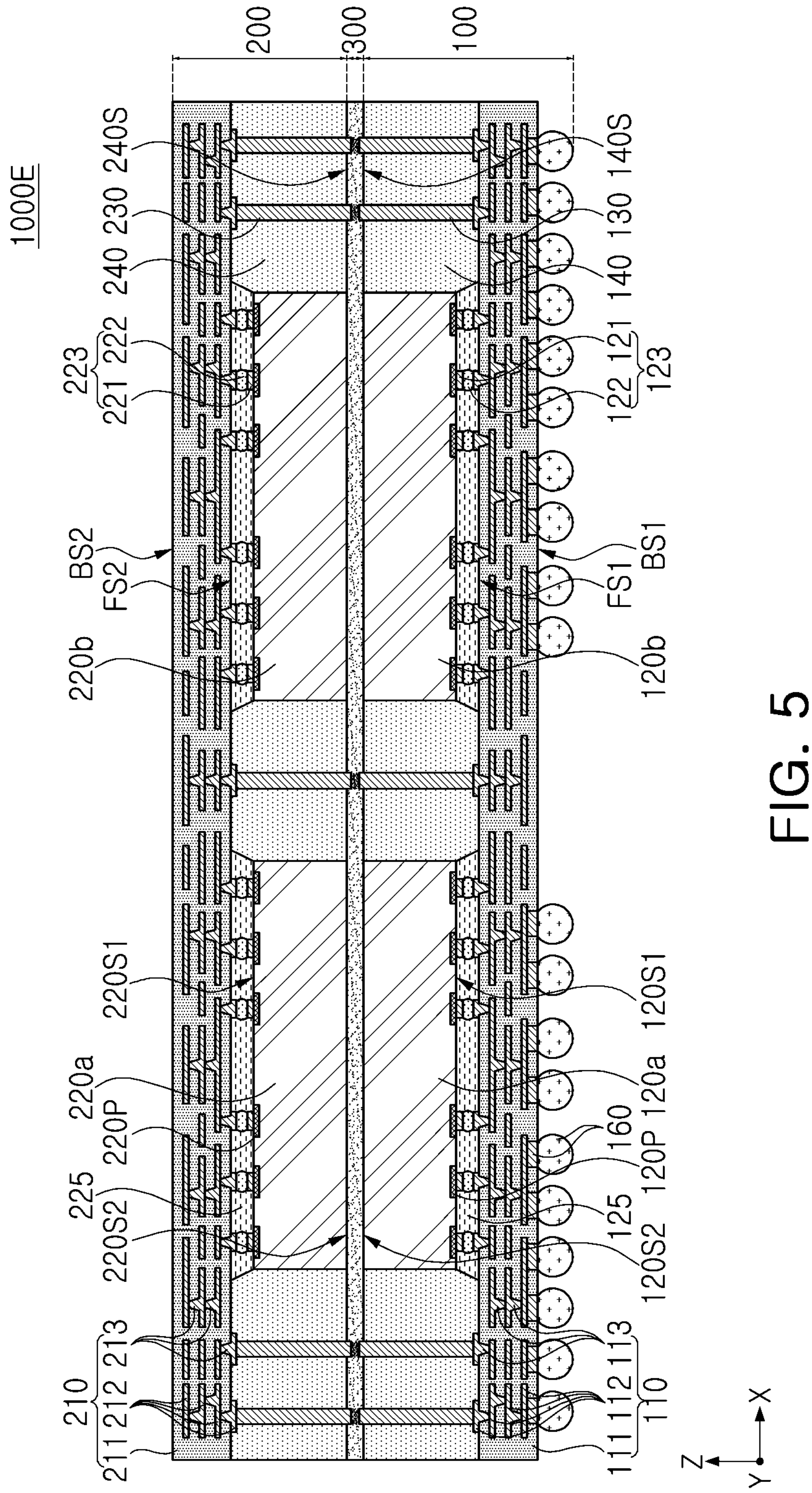
FIG. 5 is a cross-sectional view of a semiconductor package according to an embodiment of the present inventive concept.

FIG. 5 is a cross-sectional view illustrating a semiconductor package 1000E according to an embodiment of the present inventive concept.

Referring to FIG. 5, the semiconductor package 1000E of an embodiment of the present inventive concept may have characteristics the same as or similar to those described above with reference to FIGS. 1A to 4B, except that the semiconductor package 1000E includes a plurality of first semiconductor chips 120*a* and 120*b* and a plurality of second semiconductor chips 220*a* and 220*b*. In an embodiment of the present inventive concept, the plurality of first semiconductor chips 120*a* and 120*b* may be arranged in a horizontal direction (e.g., an X-direction) on the first redistribution structure 110, and the plurality of second semiconductor chips 220*a* and 220*b* may be arranged in a horizontal direction (e.g., the X-direction) on the second redistribution structure 210. According to some embodiments of the present inventive concept, the plurality of first semiconductor chips 120*a* and 120*b* and the plurality of second semiconductor chips 220*a* and 220*b* may be stacked on one another in a vertical direction (e.g., the Z-direction). The plurality of first semiconductor chips 120*a* and 120*b* and the plurality of second semiconductor chips 220*a* and 220*b* may include the same type of semiconductor chip, e.g., GDDR RAM, but the present inventive concept is not limited thereto.

FIGS. 6A to 6G are cross-sectional views illustrating a sequential process of a manufacturing process of the semiconductor package 1000A of FIG. 1A.

Figure 6A:
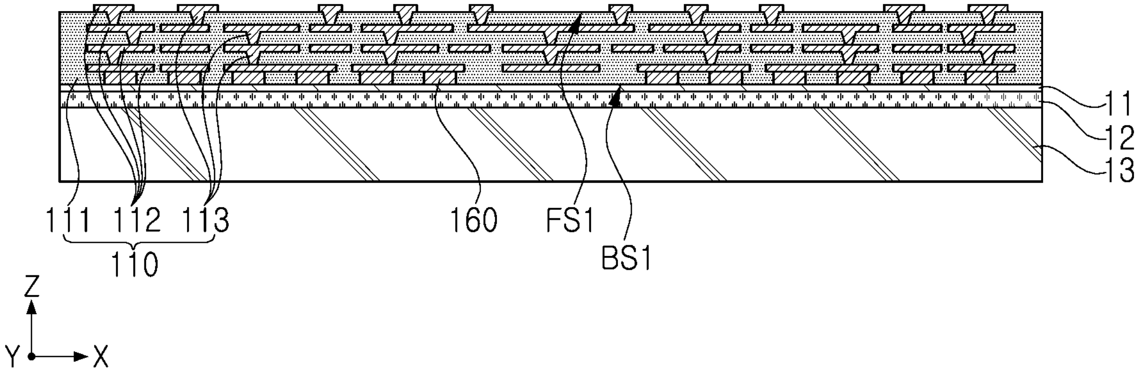
FIGS. 6A, 6B, 6C, 6D, 6E, 6F and 6G are cross-sectional views illustrating a sequential process of a manufacturing process of the semiconductor package of FIG. 1A.

Referring to FIG. 6A, the first redistribution structure 110 may be formed on a carrier. The carrier may include a lower layer 13, a middle layer 12, and an upper layer 11. The lower layer 13, the middle layer 12, and the upper layer 11 may include different materials from each other. For example, the lower layer 13 may be a copper clad laminate (CCL), and the middle layer 12 may be a polymer layer including a curable resin. Further, the upper layer 11 may be a metal layer including nickel (Ni), titanium (Ti), and the like.

The first redistribution structure 110 may include a first insulating layer 111, a first redistribution layer 112, and a first redistribution via 113. The first insulating layer 111 may be formed by sequentially applying and curing a photosensitive material, for example, PID. The first redistribution layer 112 and the first redistribution via 113 may be formed by forming a via hole, that passes through the first insulating layer 111 by performing an exposure process, and by a development process and patterning of a metal material on the first insulating layer 111 using a plating process. By repeating the process described above, the first redistribution structure 110 including a plurality of first redistribution layers 112 may be formed. A barrier layer including nickel (Ni), gold (Au), or alloys thereof may be formed on the uppermost first redistribution layer 112 that is disposed on the first front surface FS1 of the first redistribution structure 110. The bump structure 160 (pillar portion) may be formed below the lowermost first redistribution layer 112, but the present inventive concept is not limited thereto. According to some embodiments of the present inventive concept, the bump structure 160 (pillar portion) may be formed after the carrier is removed.

Figure 6B:
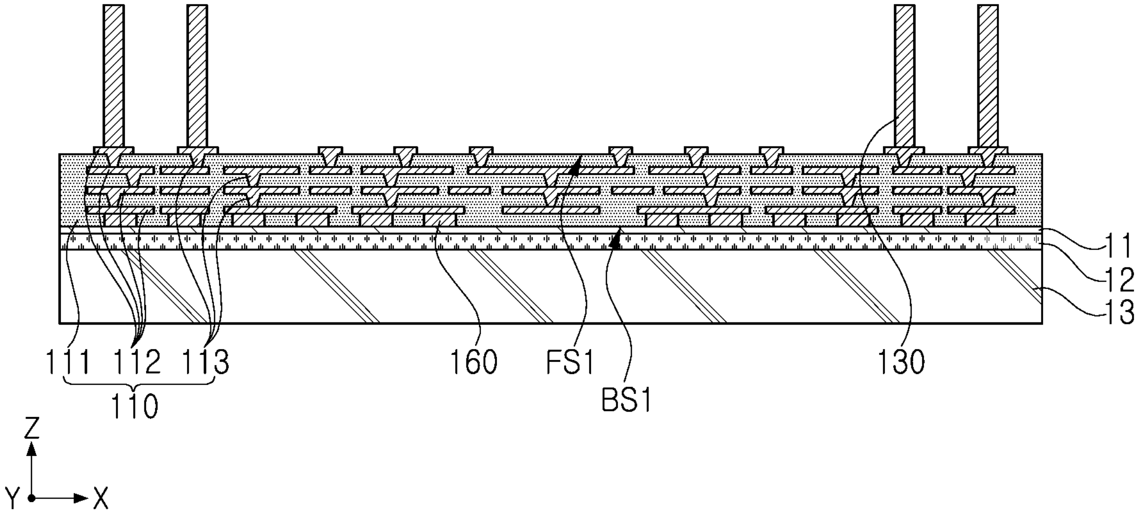

Referring to FIG. 6B, a first through-via 130 may be formed on the uppermost first redistribution layer 112. The first through-via 130 may be formed by performing a plating process. According to some embodiments of the present inventive concept, a metal seed layer including titanium (Ti), copper (Cu), or the like may be formed on a lower surface of the first through-via 130.

Figure 6C:
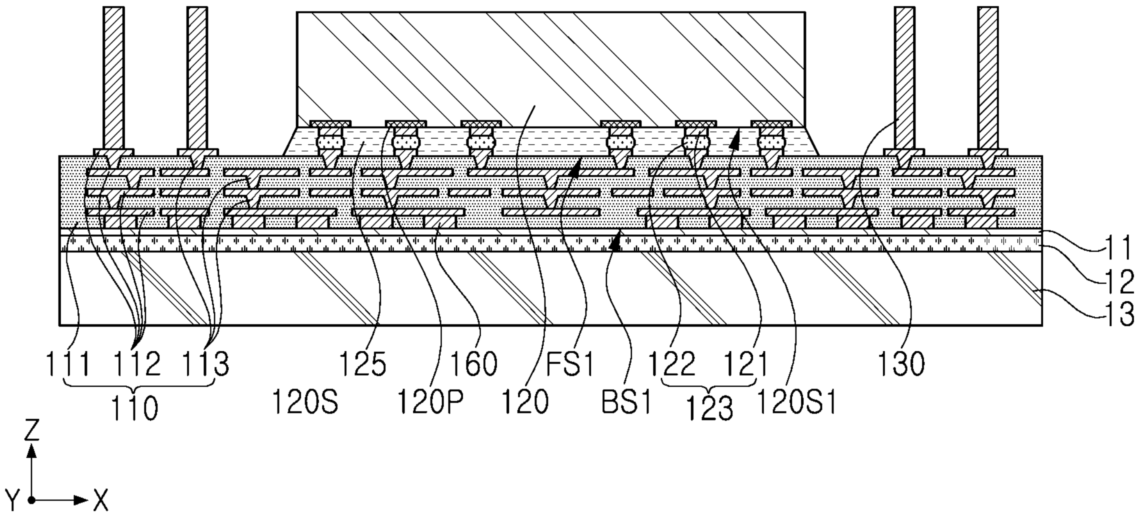

Referring to FIG. 6C, the first semiconductor chip 120 may be disposed on the first front surface FS1 of the first redistribution structure 110. The first semiconductor chip 120 may be mounted in a flip-chip manner. For example, the first semiconductor chip 120 may be connected to the first redistribution layer 112 through the first connection bumps 123 that are formed on the connection pads 120P.

The underfill layer 125 may be formed between the first semiconductor chip 120 and the first redistribution structure 110. The underfill layer 125 may be formed using a capillary underfill (CUF) process, but the present inventive concept is not limited thereto.

Figure 6D:
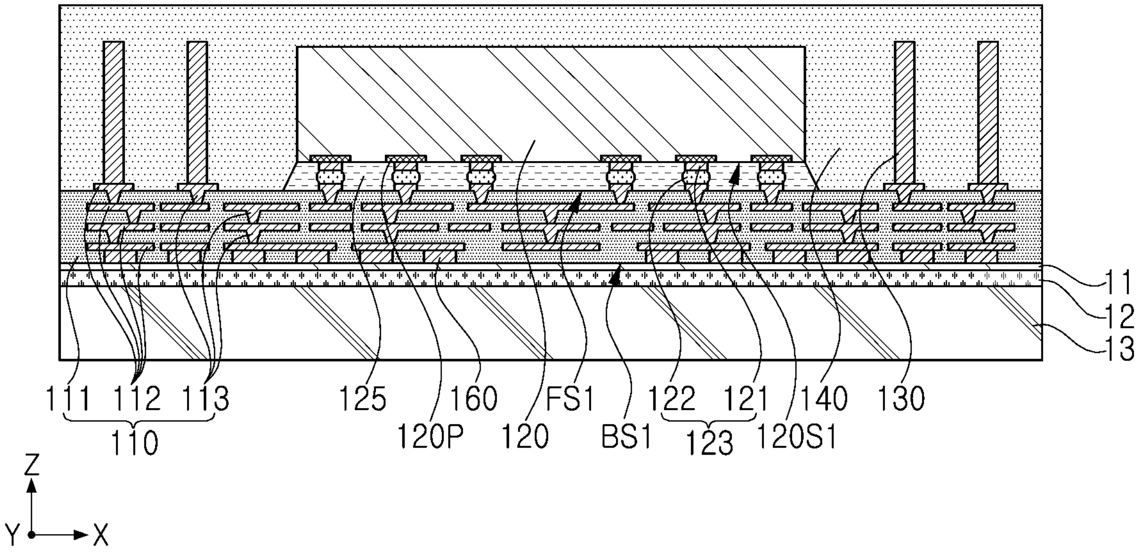

Referring to FIG. 6D, the first encapsulant 140 may be formed to encapsulate the first semiconductor chip 120 and the first through-via 130. The first encapsulant 140 may be formed to cover upper surfaces of the first semiconductor chip 120 and the first through-via 130. For example, the first encapsulant 140 may be formed to completely cover upper surfaces of the first semiconductor chip 120 and the first through-via 130. The first encapsulant 140 may be formed by applying and curing an insulating resin. The insulating resin may include, for example, EMC.

Figure 6E:
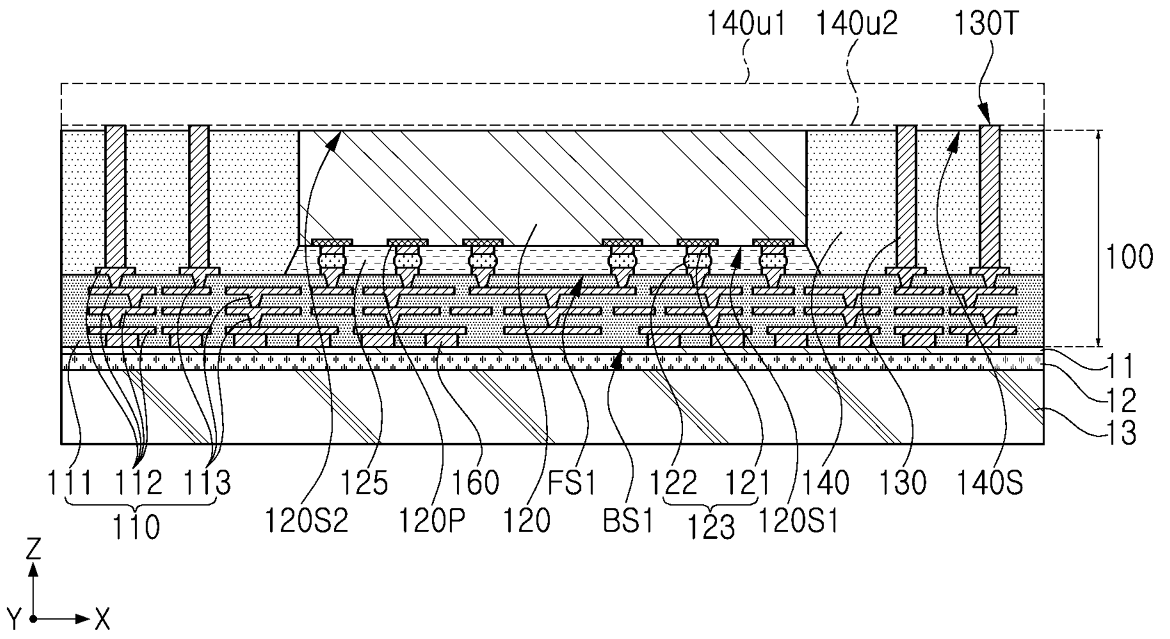

Referring to FIG. 6E, upper portions 140*u*1 and 140*u*2 of the first encapsulant 140 may be removed to expose the first semiconductor chip 120 and the first through-via 130. For example, the first portion 140*u*1 of the first encapsulant 140 may be removed by applying a planarization process, and then the second portion 140*u*2 of the first encapsulant 140 may be removed by applying an etch-back process. The first non-active surface 120S2 of the first semiconductor chip 120 and the upper end 130T of the first through-via 130 may be exposed by the surface 140S of the first encapsulant 140. The upper end 130T of the first through-via 130 may protrude, relative to the first non-active surface 120S2 of the first semiconductor chip 120 and the surface 140S of the first encapsulant 140.

Figure 6F:
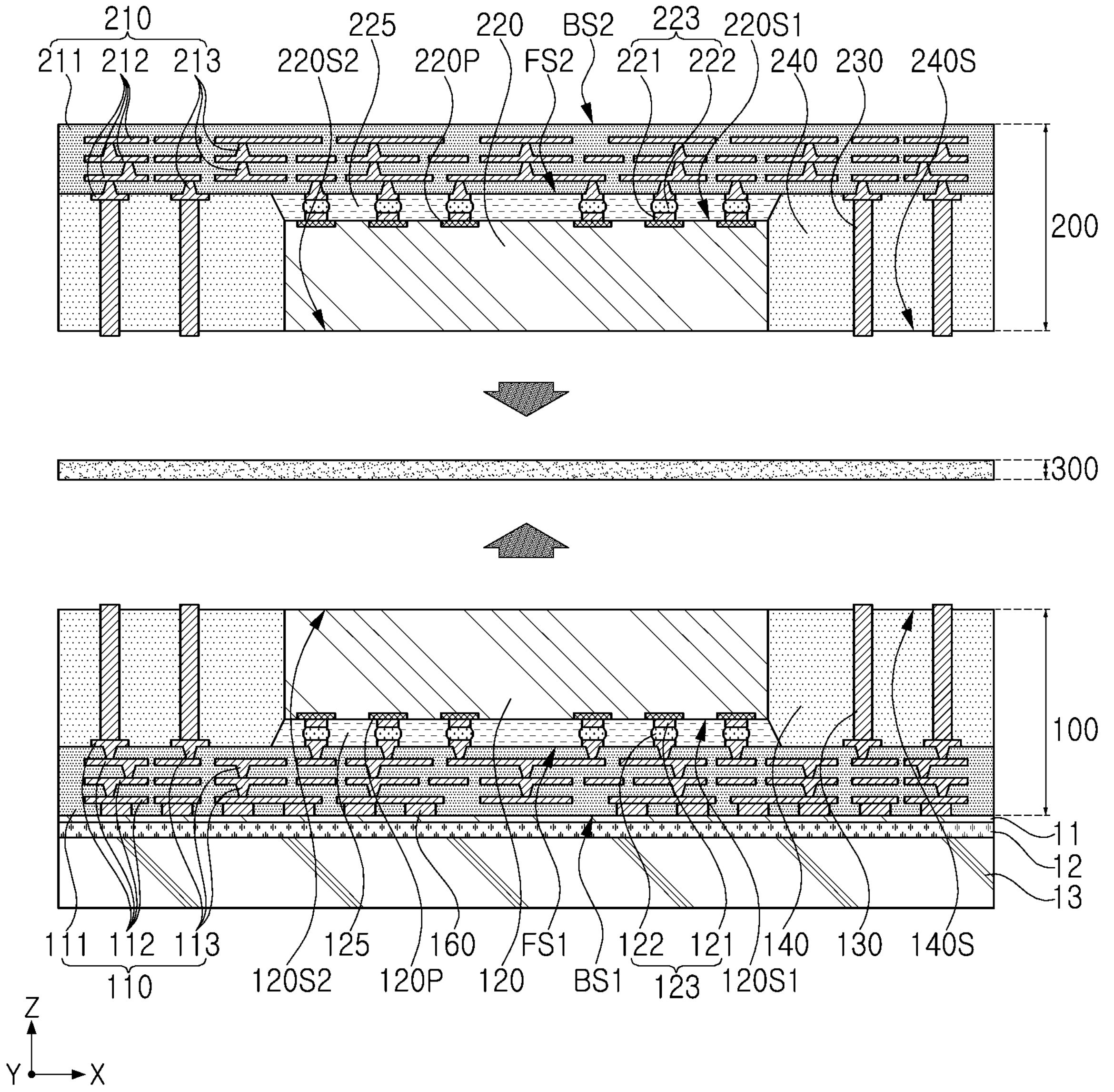

Referring to FIG. 6F, the first package structure 100 and the second package structure 200 may be bonded and combined to each other using the film structure 300. The second package structure 200 may be formed by performing a process similar to that of FIGS. 6A to 6E. The first package structure 100 and the second package structure 200 may be compressed to both sides of the film structure 300, respectively, so that the first through-vias 130 and the second through-vias 230 overlap each other. For example, first, the film structure 300 may be attached to the surface 140S of the first encapsulant 140, and then second package structure may be compressed to the film structure 300 so that the first through-via 130 and the second through-via 230 may be electrically connected to each other.

Figure 6G:
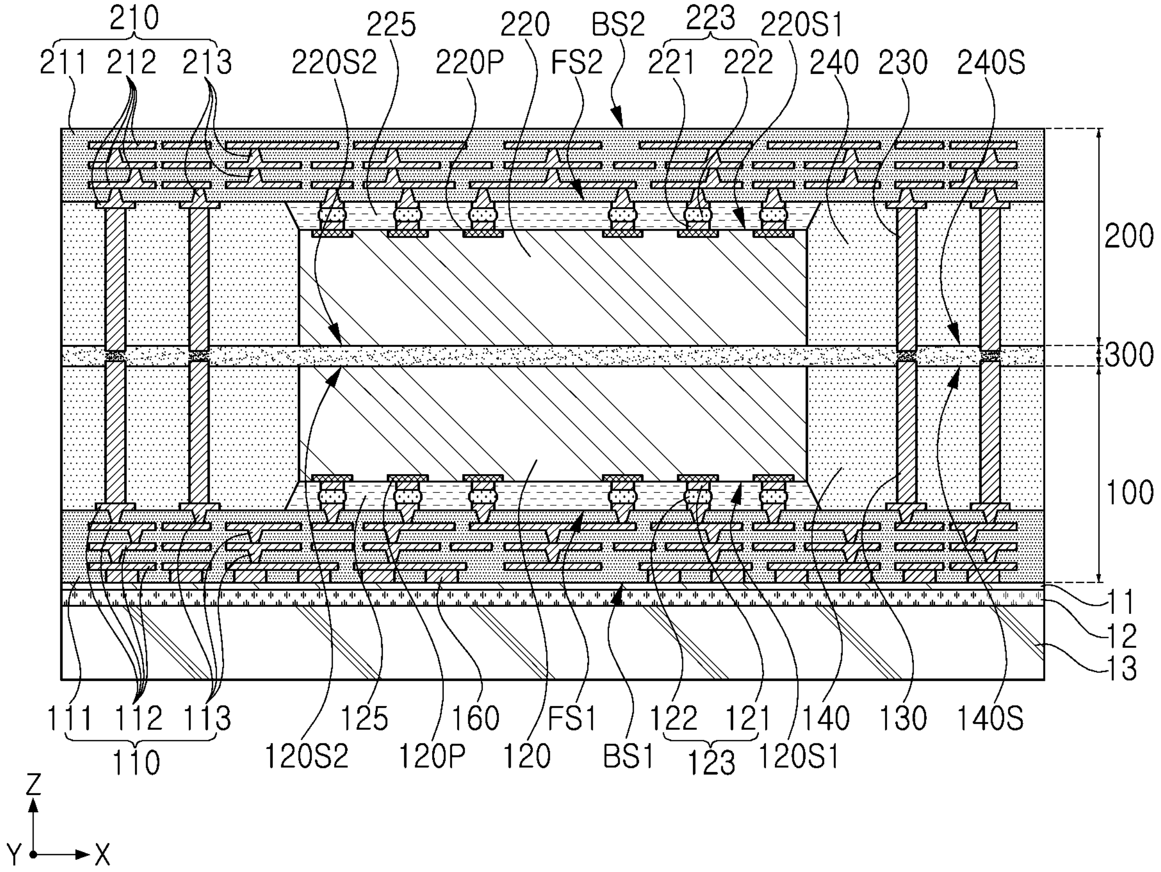

Referring to FIG. 6G, the film structure 300 may be disposed between the first package structure 100 and the second package structure 200 to electrically connect the first through-vias 130 to the second through-vias 230. The first through-via 130 and the second through-via 230 may be electrically connected to each other by conductive particles in the film structure 300. Thereafter, the lower layer 13 may be separated, and the middle layer 12 and the upper layer 11 may be removed to expose the first rear surface BS2 of the first redistribution structure 110. Next, solder balls may be attached to the bump structure 160 and a sawing process may be performed thereon to complete the semiconductor package illustrated in FIG. 1A.

As described above, according to an embodiment of the present inventive concept, by minimizing the interface formed between the encapsulant (e.g., '140' or '240') and the semiconductor chip (e.g., '120' or '220'), process risks, such as voids and interface delamination, may be reduced and heat dissipation characteristics of a semiconductor package may be improved. In addition, since the first package structure 100 and the second package structure 200, which are discontinuously and independently manufactured, are physically and electrically combined by the film structure 300, process risk may be reduced.

According to embodiments of the present inventive concept, the semiconductor package having improved heat dissipation, and yield may be provided by combining independently formed package structures to each other.

While the present inventive concept has been described with reference to embodiments thereof, it will be understood by those of ordinary skill in the art that various changes in form and details may be made thereto without departing from the spirit and scope of the present inventive concept.

What is claimed is:

1. A semiconductor package comprising:

a first package structure including a first redistribution structure, at least one first semiconductor chip, a first encapsulant, and a first through-via, wherein the first redistribution structure has a first front surface and a first rear surface, which oppose each other, and includes a first redistribution layer, wherein the at least one first semiconductor chip has a first active surface and a first non-active surface opposite to the first active surface, wherein a first connection pad is disposed on the first active surface and is electrically connected to the first redistribution layer, wherein the at least one first semiconductor chip is disposed on the first redistribution structure such that the first active surface faces the first front surface, wherein the first encapsulant covers at least a portion of the at least one first semiconductor chip, and wherein the first through-via is electrically connected to the first redistribution layer and passes through the first encapsulant;

a second package structure including a second redistribution structure, at least one second semiconductor chip, a second encapsulant, and a second through-via, wherein the second redistribution structure has a second front surface and a second rear surface, which oppose each other, and includes a second redistribution layer, wherein the at least one second semiconductor chip has a second active surface and a second non-active surface opposite to the second active surface, wherein a second connection pad is disposed on the second active surface and is electrically connected to the second redistribution layer, wherein the at least one second semiconductor chip is disposed on the second redistribution structure such that the second active surface faces the second front surface, wherein the second encapsulant covers at least a portion of the at least one second semiconductor chip, and wherein the second through-via is electrically connected to the second redistribution layer and the first through-via and passes through the second encapsulant, wherein the second package structure is disposed on the first package structure such that the second front surface faces the first front surface, wherein at least one of a first upper end of the first through-via or a second upper end of the second through-via, which face each other, is located on a level that is between the first non-active surface and the second non-active surface.

2. The semiconductor package of claim 1, further comprising:

a film structure disposed between the first package structure and the second package structure and electrically connecting the first through-via to the second through-via.

3. The semiconductor package of claim 2, wherein the film structure is an anisotropic conductive film (ACF).

4. The semiconductor package of claim 2, wherein the first upper end of the first through-via protrudes from a surface of the first encapsulant that is opposite to the first front surface.

5. The semiconductor package of claim 2, wherein the second upper end of the second through-via protrudes from a surface of the second encapsulant that is opposite to the second front surface.

6. The semiconductor package of claim 1, wherein the at least one first semiconductor chip further includes a first bonding layer disposed on the first non-active surface, and the at least one second semiconductor chip further includes a second bonding layer disposed on the second non-active surface and contacting the first bonding layer.

7. The semiconductor package of claim 6, wherein each of the first bonding layer and the second bonding layer includes at least one of silicon oxide (SiO), silicon nitride (SiN), or silicon carbonitride (SiCN).

8. The semiconductor package of claim 6, wherein the first upper end of the first through-via and the second upper end of the second through-via are in direct contact with each other.

9. The semiconductor package of claim 1, wherein the first redistribution structure further includes a first insulating layer providing the first front surface and the first rear surface and having the first redistribution layer disposed therein, the second redistribution structure further includes a second insulating layer providing the second front surface and the second rear surface and having the second redistribution layer disposed therein, at least a portion of the first redistribution layer adjacent to the first rear surface is exposed from the first insulating layer, and the second redistribution layer adjacent to the second rear surface is not exposed from the second insulating layer.

10. The semiconductor package of claim 9, further comprising a bump structure disposed on the first rear surface and connected to the at least a portion of the first redistribution layer.

11. The semiconductor package of claim 1, wherein the first redistribution layer includes first front pads disposed on the first front surface, the second redistribution layer includes second front pads disposed on the second front surface, and each of the first and second redistribution layers further includes barrier layers disposed on the first and second front pads.

12. The semiconductor package of claim 11, further comprising:

a first connection bump connecting at least a portion of the first connection pad of the at least one first semiconductor chip and the first front pads to each other; and a second connection bump connecting at least a portion of the second connection pad of the at least one second semiconductor chip and the second front pads to each other.

13. The semiconductor package of claim 11, wherein the first through-via has a first lower end opposite to the first upper end and contacting at least a portion of the barrier layers disposed on the first front pads, and the second through-via has a second lower end opposite to the second upper end and contacting at least a portion of the barrier layers disposed on the second front pads.

14. The semiconductor package of claim 1, wherein the first non-active surface of the at least one first semiconductor chip is exposed from the first encapsulant, and the second non-active surface of the at least one second semiconductor chip is exposed from the second encapsulant.

15. A semiconductor package comprising:

a first package structure including a first redistribution structure, a first semiconductor chip, a first encapsulant, and a first through-via, wherein the first redistribution structure includes a first redistribution layer, wherein the first semiconductor chip has a first active surface and a first non-active surface opposite to the first active surface, wherein a first connection pad is electrically connected to the first redistribution layer and is disposed on the first active surface, wherein the first semiconductor chip is disposed such that the first active surface faces the first redistribution structure, wherein the first encapsulant covers at least a portion of the first semiconductor chip, and wherein the first through-via is electrically connected to the first redistribution layer and passes through the first encapsulant;

a second package structure including a second redistribution structure, a second semiconductor chip, a second encapsulant, and a second through-via, wherein the second redistribution structure includes a second redistribution layer, wherein the second semiconductor chip has a second active surface and a second non-active surface opposite to the second active surface, wherein a second connection pad is electrically connected to the second redistribution layer and is disposed on the second active surface, wherein the second semiconductor chip is disposed such that the second active surface faces the second redistribution structure, wherein the second encapsulant covers at least a portion of the second semiconductor chip, and wherein the second through-via is electrically connected to the second redistribution layer and passes through the second encapsulant, wherein the second redistribution structure is disposed on the first package structure such that the second non-active surface faces the first non-active surface; and a film structure including an insulating resin and conductive particles, wherein the insulating resin fills a gap between the first package structure and the second package structure, wherein the conductive particles are dispersed in the insulating resin to electrically connect the first through-via to the second through-via.

16. The semiconductor package of claim 15, wherein at least one of the first through-via or the second through-via extends into the insulating resin.

17. The semiconductor package of claim 15, wherein the first encapsulant is not disposed between the first non-active surface and the film structure, the second encapsulant is not disposed between the second non-active surface and the film structure.

18. A semiconductor package comprising:

a first package structure including a first redistribution structure, a first semiconductor chip, a first encapsulant, and a first through-via, wherein the first redistribution structure includes a first insulating layer, which provides a first front surface and a first rear surface, and a first redistribution layer that is disposed within the first insulating layer, wherein the first semiconductor chip is disposed on the first front surface, wherein the first encapsulant covers at least a portion of the first semiconductor chip, and wherein the first through-via is electrically connected to the first redistribution layer and passes through the first encapsulant;

a second package structure including a second redistribution structure, a second semiconductor chip, a second encapsulant, and a second through-via, wherein the second redistribution structure includes a second insulating layer, which provides a second front surface and a second rear surface, and a second redistribution layer disposed within the second insulating layer, wherein the second semiconductor chip is disposed on the second front surface, wherein the second encapsulant covers at least a portion of the second semiconductor chip, and wherein the second through-via electrically connects the second redistribution layer to the first through-via and passes through the second encapsulant, wherein the second package structure is disposed on the first package structure such that the second front surface and the first front surface face each other; and a bump structure disposed on the first rear surface of the first package structure and electrically connected to at least a portion of the first redistribution layer that is exposed from the first insulating layer, wherein the second insulating layer covers a surface of the second redistribution layer that is adjacent to the second rear surface.

19. The semiconductor package of claim 18, further comprising an anisotropic conductive film disposed between the first package structure and the second package structure and electrically connecting the first through-via to the second through-via.

20. The semiconductor package of claim 18, wherein the first through-via has a first lower end, which is electrically connected to the first redistribution layer, and a first upper end, which is electrically connected to the second through-via, and the second through-via has a second lower end, which is electrically connected to the second redistribution layer, and a second upper end, which is electrically connected to the first through-via.

* * * * *